(12) United States Patent
Sekiguchi et al.

(10) Patent No.: US 8,962,982 B2
(45) Date of Patent: Feb. 24, 2015

(54) DYE-SENSITIZED SOLAR CELL

(75) Inventors: Takashi Sekiguchi, Osaka (JP); Shingo Kambe, Osaka (JP); Satoko Kambe, legal representative, Osaka (JP); Shigeo Yamada, Sodegaura (JP); Tatsuya Ooashi, Toride (JP)

(73) Assignee: Nippon Soda Co., Ltd., Tokyo (JP)

( * ) Notice: Subject to any disclaimer, the term of this patent is extended or adjusted under 35 U.S.C. 154(b) by 601 days.

(21) Appl. No.: 13/000,899

(22) PCT Filed: Jun. 22, 2009

(86) PCT No.: PCT/JP2009/002840
§ 371 (c)(1),
(2), (4) Date: Dec. 20, 2011

(87) PCT Pub. No.: WO2009/157175
PCT Pub. Date: Dec. 30, 2009

(65) Prior Publication Data
US 2012/0090678 A1    Apr. 19, 2012

(30) Foreign Application Priority Data

Jun. 24, 2008 (JP) ................................ 2008-164418

(51) Int. Cl.
*H01L 31/0224* (2006.01)
*H01L 51/42* (2006.01)
(Continued)

(52) U.S. Cl.
CPC .......... *H01L 51/4226* (2013.01); *H01G 9/2022* (2013.01); *H01G 9/2031* (2013.01); *H01G 9/2059* (2013.01); *H01L 51/0021* (2013.01); *H01L 51/0086* (2013.01);
(Continued)

(58) Field of Classification Search
CPC .............. Y02E 10/542; H01L 51/4226; H01L 2251/306; H01L 2251/308
USPC .................................................. 136/242–259
See application file for complete search history.

(56) References Cited

U.S. PATENT DOCUMENTS 4,485,125 A * 11/1984 Izu et al. .......................... 427/74
5,683,832 A   11/1997 Bonhote et al.
(Continued)

FOREIGN PATENT DOCUMENTS

EP    0 718 288 A1    6/1996
EP    1628310         2/2005
(Continued)

OTHER PUBLICATIONS

Machine translation of JP 2005-302695A to Fukano et al.*
(Continued)

*Primary Examiner* — Keith Hendricks
*Assistant Examiner* — Kourtney S Carlson
(74) *Attorney, Agent, or Firm* — Greenblum & Bernstein, P.L.C.

(57) ABSTRACT

A dye-sensitized solar cell of the present invention including: an electrode having, on one surface, a semiconductor layer with a sensitizing dye supported thereon, a counter electrode positioned opposing the semiconductor layer, and a charge transport layer disposed between the electrode and the counter electrode, wherein at least one of the electrode and the counter electrode is a transparent conductive film prepared by laminating an ITO film and an FTO film, and part or all of the crystal structure of the surface of the FTO film is orthorhombic.

4 Claims, 1 Drawing Sheet

(51) Int. Cl.
  *H01G 9/20* (2006.01)
  *H01L 51/00* (2006.01)
  *H01L 51/44* (2006.01)

(52) U.S. Cl.
  CPC ........ *H01L 51/442* (2013.01); *H01L 2251/306* (2013.01); *H01L 2251/308* (2013.01); *Y02E 10/542* (2013.01)
  USPC ........................................................ 136/256

(56) References Cited

U.S. PATENT DOCUMENTS

| | | | |
|---|---|---|---|
| 2003/0170437 A1 | 9/2003 | Kawashima et al. | |
| 2006/0285213 A1 | 12/2006 | Kanda et al. | |
| 2008/0210296 A1* | 9/2008 | Morooka et al. | 136/252 |
| 2008/0237760 A1 | 10/2008 | Kawashima et al. | |
| 2008/0264487 A1* | 10/2008 | Takahashi et al. | 136/263 |
| 2008/0314448 A1* | 12/2008 | Kato et al. | 136/261 |
| 2009/0301556 A1 | 12/2009 | Kawano et al. | |
| 2010/0147385 A1 | 6/2010 | Kawano et al. | |

FOREIGN PATENT DOCUMENTS

| | | | |
|---|---|---|---|
| EP | 1628310 | | 2/2006 |
| JP | 1-132004 A | | 5/1989 |
| JP | 7-198648 | | 8/1995 |
| JP | 2003-323818 A | | 11/2003 |
| JP | 2005-302695 A | | 10/2005 |
| JP | 2005302695 A | * | 10/2005 |
| WO | 95/18456 A1 | | 7/1995 |
| WO | WO 2005119794 A1 | * | 12/2005 |
| WO | 2006/123785 | | 11/2006 |

OTHER PUBLICATIONS

Romano-Rodriguez A et al., "Microstructure and morphology of tin dioxide multilayer thin film gas sensors", Sensors and Actuators B, Elsevier Sequoia S.A., Lausanne, CH, vol. 44, No. 1-3, Oct. 1, 1997, pp. 268-274.

Search report from E.P.O. that issued with respect to patent family member European Patent Application No. 09769885 6, mail date is Jun. 22, 2011.

Kagaku Denki, "Recent Developments in Polymer Solid Electrolytes", Electrochemistry vol. 65 No. 11, 1997, pp. 920-925.

N. Papageorgiou et al., "The Performance and Stability of Ambient Temperature Molten Salts for Solar Cell Applications", Journal of the Electrochemical Society vol. 143, No. 10., Oct. 1996, pp. 3099-3108.

Pierre Bonhote et al., "Hydrophobic, Highly Conductive Ambient-Temperature Molten Salts", Inorganic Chemistry, vol. 35, No. 5., 1996, pp. 1168-1178.

Chen Zhiwen et al., "Facile strategy and mechanism for orthorhombic SnO2 thin films", Applied Physics Letters, AIP, American Institute of Physics, Melville, NY, US, vol. 89, No. 23, XP012087420 , Dec. 4, 2006, pp. 231902-231902.

E.P.O. Office action, mail date is Mar. 12, 2013.

* cited by examiner

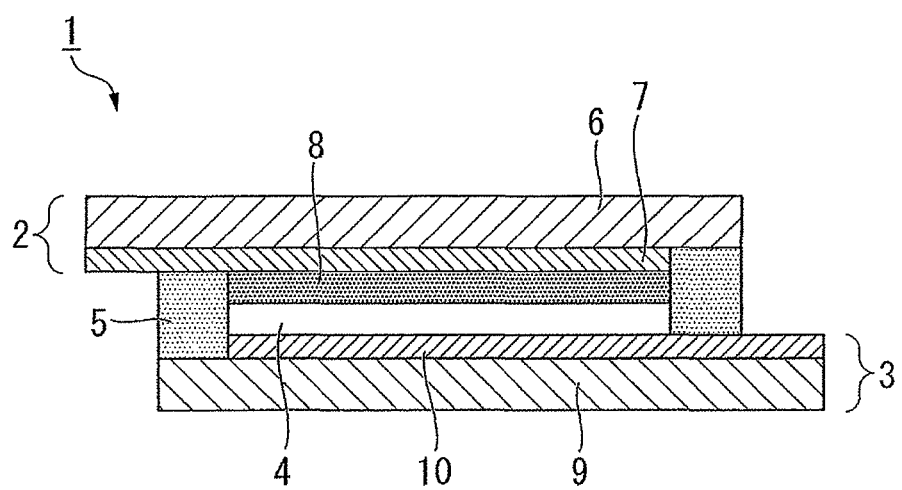

US 8,962,982 B2

DYE-SENSITIZED SOLAR CELL

TECHNICAL FIELD

The present invention relates to a dye-sensitized solar cell.
Priority is claimed on Japanese Patent Application No. 2008-164418, filed Jun. 24, 2008, the content of which is incorporated herein by reference.

BACKGROUND ART

Dye-sensitized solar cells are solar cells in which a dye that absorbs sunlight releases electrons upon absorbing light, thereby generating electricity. An article published in 1991 by Michael Gratzel of the Ecole Polytechnique Federale de Lausanne (EPFL) in Switzerland initiated the research into these solar cells. In terms of the cell mechanism, when light enters the cell, the dye inside the cell enters an excited state, thereby releasing electrons. These electrons are transported through titanium oxide ($TiO_2$) to a transparent electrode, and then flow out of the cell. Meanwhile, the dye that has been converted to cations as a result of the electron release receives electrons that have been supplied from the other electrode via iodine (I) within the electrolyte, and is thereby returned to its original state.

Examples of the types of properties required for the transparent electrode used in these types of solar cells include low resistance, favorable thermal stability and chemical stability, high light transmittance, good moisture resistance, and low cost. As the transparent conductive film of an electrode that satisfies these properties, a fluorine-doped tin oxide film (FTO film) is typically preferred to the more tin-doped indium oxide film (ITO film), as it exhibits superior stability under both thermal and chemical conditions.

However, compared with ITO films, FTO films exhibit inferior transparency and conductivity, and therefore films have been investigated in which an FTO film is laminated on top of an ITO film, thereby improving properties such as the transparency in addition to the properties of thermal stability and chemical stability (for example, see Patent Document 1).

PRIOR ART DOCUMENTS

Patent Documents

[Patent Document 1]
Japanese Unexamined Patent Application, First Publication No. 2003-323818

DISCLOSURE OF INVENTION

Problems to be Solved by the Invention

However, there is strong demand for further improvements in the efficiency and output of dye-sensitized solar cells, and improving the transparent conductive film represents one challenge.

Means to Solve the Problems

As a result of intensive investigation, the inventors of the present invention discovered that by using, as the electrode of a dye-sensitized solar cell, a transparent conductive film prepared by laminating an FTO film in which part or all of the crystal structure of the film surface is orthorhombic onto the surface of an ITO film, a high conversion efficiency and high output could be achieved, and they were therefore able to complete the present invention.

In other words, the present invention relates to the aspects described below.
(1) A dye-sensitized solar cell including: an electrode having, on one surface, a semiconductor layer with a sensitizing dye supported thereon, a counter electrode positioned opposing the semiconductor layer, and a charge transport layer disposed between the electrode and the counter electrode, wherein the electrode is a transparent conductive film prepared by laminating an ITO film and an FTO film, and part or all of the crystal structure of the surface of the FTO film is orthorhombic.
(2) The dye-sensitized solar cell according to (1), wherein the sheet resistance of the transparent conductive film is not more than 300 Ω/sq.
(3) The dye-sensitized solar cell according to (1) or (2), wherein the concentration of $I_3^-$ contained within the charge transport layer exceeds 0 mol/dm$^3$ but is not more than 0.02 mmol/dm$^3$.

Effect of the Invention

In the transparent conductive film composed of an FTO/ITO laminated film according to the present invention, because part or all of the FTO film surface has an orthorhombic crystal structure, a dye-sensitized solar cell with excellent heat resistance, a high conversion efficiency and high output can be obtained even when the FTO film is a thin film with a thickness of 5 to 20 nm.

BRIEF DESCRIPTION OF THE DRAWINGS

FIG. 1 is a cross-sectional view illustrating one example of a photoelectric conversion element of the present invention.

BEST MODE FOR CARRYING OUT THE INVENTION

A description of the structure of a dye-sensitized solar cell according to the present invention is presented below with reference to the drawing. As illustrated in FIG. 1, a photoelectric conversion element 1 according to the present invention has a structure in which a charge transport layer 4 is sandwiched between a substrate 2 (a first substrate 2) and a substrate 3 (a second substrate 3), and the outer periphery of the charge transport layer 4 is sealed with a sealing material 5. The substrate 2 has a base material 6 (a first base material 6), an electrode layer 7 formed on the surface of the base material 6 and a porous semiconductor layer 8 formed on the surface of the electrode layer 7, and is positioned with the semiconductor layer 8 facing the substrate 3. The substrate 3 has a base material 9 (a second base material 9) and a counter electrode layer 10 formed on the surface of the base material 9, and is positioned with the counter electrode layer 10 facing the substrate 2. A sensitizing dye is supported on the porous semiconductor layer 8 formed on the surface of the electrode layer 7.

Either one or both of the base material 6 and the electrode layer 7 formed on the surface thereof, or the base material 9 and the counter electrode layer 10 formed on the surface thereof are formed so as to be transparent, thus enabling light to enter the porous semiconductor layer 8.
(Transparent Conductive Film)

A transparent conductive film of the present invention is used for at least one of the electrode layer 7 and the counter electrode layer 10, and is prepared by providing an ITO film on a transparent base material, and then laminating an FTO film on top of the ITO film. A part or all of the surface of the FTO film (on the side of the porous semiconductor layer 8) has an orthorhombic crystal structure.

In the present invention, the description that a "part of the surface has an orthorhombic crystal structure" means a state wherein the surface structure contains at least sufficient orthorhombic crystals to ensure that a degree of change in the sheet resistance is not more than 1.5-fold. This "degree of change in the sheet resistance" is calculated by dividing the sheet resistance value following heating of the transparent conductive film at 350° C. for one hour by the sheet resistance value prior to the heating. In those cases where part of the crystal structure is orthorhombic, the remainder may be tetragonal or some other crystal system, and is typically a mixed state.

Of the seven crystal systems commonly used in the field of crystallography (namely, cubic, hexagonal, rhombohedral, tetragonal, orthorhombic, monoclinic and triclinic), the orthorhombic system is the system in which the relationship between the axial lengths is a≠b≠c, and the relationship between the axial angles is $\alpha=\beta=\gamma=90°$. Identification of the crystal system can be achieved by single crystal or powder X-ray diffraction, powder neutron diffraction, or electron diffraction or the like.

In order to produce an orthorhombic crystal structure, particularly in those cases where deposition is conducted using a pyrosol process, then as described below, a method must be employed in which the transparent base material is transported on a belt through a plurality of interconnected deposition furnaces, with the ITO film being deposited on the transparent base material in one deposition furnace, and the FTO film then being deposited in a continuous manner in the next interconnected deposition furnace. If, following deposition of the ITO film within the deposition furnace, the structure temporarily exits the deposition furnace before being reintroduced into the next deposition furnace for deposition of the FTO film, then the surface structure of the FTO film tends to adopt a tetragonal structure, and the degree of change in the sheet resistance tends to exceed 1.5-fold.

Further, although there are no particular limitations on the thicknesses of the ITO film and the FTO film provided the resulting laminate can be used as a transparent electrode of a solar cell, in order to enable the respective advantages of the FTO and ITO to be realized, and in terms of limiting the cost, the thickness of the FTO film is preferably within a range from 5 to 20 nm, and is more preferably from 10 to 20 nm. On the other hand, the thickness of the ITO film is preferably within a range from 20 to 60 nm, and is more preferably from 30 to 50 nm.

The FTO film and the ITO film are each composed of at least one layer, but may also contain a plurality of laminated layers, provided the overall film thickness does not exceed the respective range described above.

In the laminate film of an ITO film and an FTO film disclosed in Japanese Unexamined Patent Application, First Publication No. 2003-323818, the thickness of the ITO film was within a range from 100 to 1,000 nm, and the thickness of the FTO film was within a range from 30 to 350 nm. Whereas that publication stated that the thickness of the FTO film must be at least 30 nm in order to protect the ITO film, in the transparent conductive film of the present invention, the thicknesses of both the ITO film and the FTO film can be reduced significantly.

In the transparent conductive film of the present invention, even when the FTO film is thin, with a thickness of 5 to 20 nm, the heat resistance to temperatures of 350° C. and higher is excellent, and the degree of change in the sheet resistance following heating for one hour at a temperature of 350° C. is not more than 1.5-fold, and preferably 1.2-fold or less. Further, particularly in those cases where the transparent conductive film is to be used as the transparent electrode within a dye-sensitized solar cell, a sheet resistance of not more than 300 Ω/sq is desirable, and by adjusting the film thickness values, a sheet resistance of not more than 300 Ω/sq can be achieved.

(Transparent Base Material)

The transparent conductive film of the present invention is laminated to a transparent base material.

Specific examples of the transparent base material include glass materials such as alkali glass and quartz glass, polyesters such as polycarbonates, polyethylene terephthalate and polyarylates, polyethersulfone-based resins, amorphous polyolefins, polystyrene and acrylic resins. The most appropriate of these materials may be selected in accordance with the intended application of the final product.

If required, an inorganic oxide film may be formed between the transparent base material and the transparent conductive film to prevent alkali components and the like from entering the transparent conductive film. Specific examples of this inorganic oxide film include films composed of silicon oxide ($SiO_2$), aluminum oxide ($Al_2O_3$), titanium oxide ($TiO_2$), zirconium oxide ($ZrO_2$), yttrium oxide ($Y_2O_3$), ytterbium oxide ($Yb_2O_3$), magnesium oxide (MgO), tantalum oxide ($Ta_2O_5$), cerium oxide ($CeO_2$) and hafnium oxide ($HfO_2$), as well as polysilane films formed from organopolysilane compounds, $MgF_2$ film, $CaF_2$ film, and composite oxide films of $SiO_2$ and $TiO_2$.

(Method of Producing Transparent Conductive Film)

The method used for producing the transparent conductive film may be any method that enables deposition of a film having the physical properties targeted by the present invention, and specific examples of methods that may be used include sputtering methods, electron beam methods, ion plating methods, screen printing methods, chemical vapor deposition methods (CVD methods), spray pyrolysis methods and pyrosol methods, and of these, a pyrosol method is particularly desirable.

A description of a production method of the present invention using a pyrosol process is described below.

The indium compound contained within the ITO film-forming solution is preferably a material that decomposes under heat to form indium oxide, and specific examples include indium tris(acetylacetonate) ($In(CH_3COCH COCH_3)_3$), indium tris(benzoylmethanate) ($In(C_6H_5COCHCOC_6H_5)_3$), indium trichloride ($InCl_3$), indium nitrate ($In(NO_3)_3$) and indium triisopropoxide ($In(OPr-i)_3$).

Further, the tin compound contained within the ITO film-forming solution is preferably a compound that decomposes under heat to form stannic oxide, and specific examples include stannic chloride, dimethyltin dichloride, dibutyltin dichloride, tetrabutyltin, stannous octoate ($Sn(OCOC_7H_{15})_2$), dibutyltin maleate, dibutyltin acetate and dibutyltin bis(acetylacetonate).

Moreover, in addition to the above-mentioned indium compound and tin compound, the ITO film may also be formed with an additional third component, examples of which include group 2 elements from the periodic table such as Mg, Ca, Sr and Ba, group 3 elements such as Sc and Y, lanthanoids such as La, Ce, Nd, Sm and Gd, group 4 elements such as Ti, Zr and Hf, group 5 elements such as V, Nb and Ta, group 6 elements such as Cr, Mo and W, group 7 elements such as Mn, group 9 elements such as Co, group 10 elements such as Ni, Pd and Pt, group 11 elements such as Cu and Ag, group 12 elements such as Zn and Cd, group 13 elements such as B, Al and Ga, group 14 elements such as Si, Ge and Pb, group 15 elements such as P, As and Sb, and group 16 elements such as Se and Te, any of which may be added as a stand-alone element or as a compound thereof.

The tin compound contained within the FTO film-forming solution may use the above-mentioned tin compounds used in the production of the ITO film.

Examples of the fluorine compound contained within the FTO film-forming solution include hydrogen fluoride, sodium fluoride, trifluoroacetic acid, difluoroethane and bromotrifluoromethane.

The above compounds are dissolved in an organic solvent, examples of which include alcohols such as methanol and ethanol, and ketones such as acetone, methyl butyl ketone and acetylacetone, thus preparing an ITO film-forming solution and an FTO film-forming solution.

Deposition of the ITO film and the FTO film on the transparent base material using a pyrosol process is conducted in the manner described below.

A plurality of conveyor-based deposition furnaces that have been preheated to a temperature of 400 to 750° C., and preferably 400 to 550° C., are connected together, and the transparent base material is introduced into the furnace. The ITO film-forming solution is sprayed into the first conveyor furnace and the FTO film-forming solution is sprayed into the second conveyor furnace, in each case using ultrasound to form a mist of the solution and using air as a carrier gas. Upon contacting the surface of the transparent base material, the solution mist undergoes thermal decomposition, forming a film. The film thickness can be adjusted by altering the speed of the conveyor.

By interconnecting three or more deposition furnaces, at least one of the ITO film and the FTO film can be formed as a multilayer film. Further, an additional inorganic oxide film such as an $SiO_2$ film or the like may be deposited in the first deposition furnace if required.

(Other Structural Members)

The transparent conductive film of the present invention is used for at least one of the electrode layer 7 and the counter electrode layer 10, although one of these electrode layers may be formed as a non-transparent electrode. In such a case, the electrode may be formed of an unmodified metal, or may be formed by laminating a conductive material layer onto a film. Examples of preferred conductive materials include metals such as platinum, gold, silver, copper, aluminum, rhodium and indium, as well as carbon, conductive metal oxides such as indium-tin composite oxide, antimony-doped tin oxide and fluorine-doped tin oxide, complexes of the above compounds, carbon materials such as graphite, carbon nanotubes and carbon-supported platinum, and materials prepared by coating one of the above compounds with silicon oxide, tin oxide, titanium oxide, zirconium oxide or aluminum oxide or the like.

These electrodes preferably have as low a surface resistance as possible, and a preferable surface resistance range is not more than 200 Ω/sq, and more preferably 50 Ω/sq or less. There are no particular limitations on the lower limit for the surface resistance, although a value of 0.1 Ω/sq is typical.

An inorganic semiconductor material or an organic semiconductor material may be used as the semiconductor material for forming the semiconductor layer 8. Examples of inorganic semiconductor materials may be used include oxides of metal elements such as Cd, Zn, In, Pb, Mo, W, Sb, Bi, Cu, Hg, Ti, Ag, Mn, Fe, V, Sn, Zr, Sr, Ga, Si and Cr, perovskites such as $SrTiO_3$ and $CaTiO_3$, sulfides such as CdS, ZnS, $In_2S_3$, PbS, $Mo_2S$, $WS_2$, $Sb_2S_3$, $Bi_2S_3$, $ZnCdS_2$ and $Cu_2S$, metal chalcogenides such as CdSe, $In_2Se_3$, $WSe_2$, HgS, PbSe and CdTe, as well as GaAs, Si, Se, $Cd_2P_3$, $Zn_2P_3$, InE, AgBr, $PbI_2$, $HgI_2$ and $BiI_3$. Complexes containing at least one material selected from the above-mentioned semiconductor materials may also be used, including $CdS/TiO_2$, CdS/AgI, $Ag_2S/AgI$, CdS/ZnO, CdS/HgS, CdS/PbS, ZnO/ZnS, ZnO/ZnSe, CdS/HgS, $CdS_x/CdSe_{1-x}$ (0<x<1), $CdS_x/Te_{1-x}$ (0<x<1), $CdSe_x/Te_{1-x}$ (0<x<1), ZnS/CdSe, ZnSe/CdSe, CdS/ZnS, $TiO_2/Cd_3P_2$, $CdS/CdSeCd_yZn_{1-y}S$ (0<y<1) and CdS/HgS/CdS. Among these materials, $TiO_2$ is preferred in terms of avoiding photodissolution within the electrolyte that forms the charge transport layer 4, and achieving a high photoelectric conversion efficiency.

The thickness of the semiconductor layer 8 is preferably within a range from 0.1 to 100 μm. Provided the thickness satisfies this range, a satisfactory photoelectric conversion effect is obtained, and the transmittance of visible light and near infrared light is not adversely affected. The thickness of the semiconductor layer 8 is more preferably within a range from 1 to 50 μm, still more preferably from 5 to 30 μm, and most preferably from 10 to 20 μm.

The semiconductor layer 8 is porous, and the pore size is typically within a range from approximately 1 to 100 nm.

The semiconductor layer 8 may be formed by conventional methods, for example by applying a mixed solution of semiconductor particles and a binder to the surface of the electrode layer 7 using a conventional method such as a coating method using a doctor blade or bar coater, a spraying method, dip coating method, screen printing method or spin coating method or the like, and subsequently either performing heating and calcination at a temperature of 500° C. in the case where the substrate 6 is a glass material, or applying pressure using a press machine in the case where the substrate 6 is a film material.

As the sensitizing dye that is supported on the semiconductor layer 8, any dye that is typically used within conventional dye-sensitized solar cells may be used. Examples of such dyes include $RuL_2(H_2O)_2$ type ruthenium-cis-diaquadipyridyl complexes, ruthenium-tris ($RuL_3$) type transition metal complexes, ruthenium-bis($RuL_2$) type transition metal complexes, osmium-tris ($OsL_3$) type transition metal complexes, osmium-bis($OsL_2$) type transition metal complexes, zinc-tetra(4-carboxyphenyl)porphyrin, iron-hexacyanide complexes and phthalocyanines. Examples of organic dyes may be used include 9-phenylxanthene dyes, coumarin dyes, acridine dyes, triphenylmethane dyes, tetraphenylmethane dyes, quinone dyes, azo dyes, indigo dyes, cyanine dyes, merocyanine dyes and xanthene dyes. Among these dyes, ruthenium-bis($RuL_2$) derivatives exhibit a broad absorption spectrum in the visible light range, and are therefore particularly desirable.

The amount of the sensitizing dye supported on the semiconductor layer 8 is preferably within a range from $1 \times 10^{-8}$ to $1 \times 10^{-6}$ mol/cm$^2$, and more preferably from $0.1 \times 10^{-7}$ to $9.0 \times 10^{-7}$ mol/cm$^2$. Provided the amount of the sensitizing dye satisfies this range, a satisfactory and cost-effective improvement in the photoelectric conversion efficiency can be achieved.

One example of a method that may be used for supporting the sensitizing dye on the semiconductor layer 8 involves immersing the substrate 6 equipped with the electrode layer 7 having the semiconductor layer 8 coated thereon into a solution containing a dissolved metal complex dye. Any solvent capable of dissolving the metal complex dye may be used as the solvent for the solution, and examples include water, alcohol, toluene and dimethylformamide. Further, during the immersion process, while the substrate 6 equipped with the electrode layer 7 having the semiconductor layer 8 coated thereon is immersed in the metal complex dye solution for a predetermined period, the solution may be heated and refluxed, or subjected to the application of ultrasonic waves. Following supporting of the dye on the semiconductor layer 8, the structure is preferably washed with alcohol or immersed in heated alcohol under reflux in order to remove any residual sensitizing dye that has not been supported on the semiconductor layer 8.

The charge transport layer 4 can be formed using an electrolyte. There are no particular limitations on the electrolyte, provided it contains a pair of redox system components composed of an oxidant and a reductant, although a pair of redox system components in which the oxidant and reductant have the same charge is preferred. The term "redox system components" describes a pair of materials that exist, in a reversible manner, as an oxidant and reductant within a redox reaction. Specific examples of these redox system components include chlorine compound-chlorine, iodine compound-iodine, bromine compound-bromine, thallium (III) ion-thallium (H) ion, mercury (II) ion-mercury (I) ion, ruthenium (III) ion-ruthenium (II) ion, copper (II) ion-copper (I) ion, iron (III) ion-iron (II) ion, nickel (II) ion-nickel (III) ion, vanadium (III) ion-vanadium (II) ion, manganate ion-permanganate ion, ferricyanide-ferrocyanide, quinone-hydroquinone and fumaric acid-succinic acid, although this is not an exhaustive list.

Among these, iodine compound-iodine pairs are preferred, and as the iodine compound, metal iodides such as lithium iodide and potassium iodide, iodinated quaternary ammonium salt compounds such as tetraalkylammonium iodides and pyridinium iodides, and iodinated imidazolium compounds such as dimethylpropylimidazolium iodide are particularly preferable.

The iodine ($I_3^-$) concentration within the charge transport layer 4 preferably exceeds 0 mol/dm$^3$ but is not more than 0.02 mol/dm$^3$. Provided the iodine ($I_3^-$) concentration satisfies this range, coloration of the electrolyte caused by the iodine or $I_3^-$ absorbing a portion of the light within the visible spectrum, and reductions in the light absorption efficiency and the output caused by this coloration can be suppressed. Particularly in those cases where the resulting cell is used indoors, a dye-sensitized solar cell with superior output properties can be provided.

In those cases where an electrolyte is used for the charge transport layer 4, the solvent used for dissolving the electrolyte is preferably a compound that dissolves the redox system components and exhibits excellent ion conductivity. Either an aqueous solvent or an organic solvent may be used as the solvent, although an organic solvent is preferred as it produces better stability of the redox-system components. Examples of the organic solvent include carbonate compounds such as dimethyl carbonate, diethyl carbonate, methylethyl carbonate, ethylene carbonate and propylene carbonate, ester compounds such as methyl acetate, methyl propionate and γ-butyrolactone, ether compounds such as diethyl ether, 1,2-dimethoxyethane, 1,3-dioxolane, tetrahydrofuran and 2-methyl-tetrahydrofuran, heterocyclic compounds such as 3-methyl-2-oxazolidinone and 2-methylpyrrolidone, nitrile compounds such as acetonitrile, methoxyacetonitrile and propionitrile, and aprotic polar compounds such as sulfolane, dimethyl sulfoxide and dimethylformamide. These solvents may be used individually, or two or more solvents may be mixed and used in combination. Among the above solvents, carbonate compounds such as ethylene carbonate and propylene carbonate, heterocyclic compounds such as γ-butyrolactone, 3-methyl-2-oxazolidinone and 2-methylpyrrolidone, and nitrile compounds such as acetonitrile, methoxyacetonitrile, propionitrile, 3-methoxypropionitrile and valeronitrile are preferred.

The use of an ionic liquid as the above solvent may also be claimed to be effective from the viewpoints of non-volatility and flame retardancy. In this case, any conventional ionic liquid can be used, and specific examples include imidazolium-based, pyridine-based, alicyclic amine-based, aliphatic amine-based and azonium amine-based ionic liquids, as well as the structures disclosed in European Patent Publication No. 718288, International Patent Publication No. 95/18456 Pamphlet, Electrochemistry, Vol. 65, No. 11, p. 923 (1997), 3. Electrochem. Soc. Vol. 143, No. 10, p. 3099 (1996), and Inorg. Chem. Vol. 35, p. 1168 (1996).

The charge transport layer 4 may also be formed using a gel electrolyte or a polymer electrolyte. Examples of the gelling agent include polymers, gelling agents that utilize techniques such as polymer cross-linking reactions, gelling agents that employ polyfunctional monomers that can undergo polymerization, and oil gelling agents. Typically used materials can be used as the gel electrolyte or polymer electrolyte, although vinylidene fluoride-based polymers such as polyvinylidene fluoride, acrylic acid-based polymers such as polyacrylic acid, acrylonitrile-based polymers such as polyacrylonitrile, polyether-based polymers such as polyethylene oxide, and compounds having amide structures within the molecular structure are preferred.

The outer periphery (the outer periphery when viewed in a plan view) of the charge transport layer 4 that is sandwiched between the semiconductor layer 8 and the counter electrode layer 10 is sealed with a sealing material 5.

The sealing material 5 includes a thermoplastic resin such as an olefin-based resin. Of such resins, the product BYNEL manufactured by DuPont Corporation can be used particularly favorably.

The sealing material 5 is positioned so as to surround the periphery (the outer periphery when viewed in a plan view) of the sensitizing dye-supporting semiconductor layer 8, and so as to provide a space between the semiconductor layer 8 and the counter electrode layer 10 for the formation of the charge transport layer 4. At this time, the sealing material 5 is preferably positioned so as to be sandwiched between the electrode layer 7 and the counter electrode layer 10 in the manner illustrated in FIG. 1. A sealing material 5 positioned in this manner can be secured by using a hot press method or the like to sandwich the sealing material 5 between the substrates 2 and 3. Although there are no particular limitations on the conditions used in such a hot press method, applying heat and pressure under conditions including a temperature of 150 to 250° C. and a pressure of 0.5 to 2 MPa is preferred. The electrolyte used for forming the charge transport layer 4 in the space formed inside the thus secured sealing material 5 is, for example, injected into the space using a reduced pressure injection method, and is sealed by the sealing material 5, thus forming the charge transport layer 4.

The present invention is described in more detail below based on a series of examples, although the present invention is in no way limited by the following examples.

Example 1

Three conveyor furnaces (furnace (1) to (3)) that had been heated to 500° C. were interconnected, and a soda lime glass base material (320×420×0.7 mm) was fed through the conveyor furnaces. Using an $SiO_2$ film-forming solution (tetraethoxysilane (solution I)) in the first furnace, an ITO film-forming solution (an acetylacetone solution including 0.2 mol/L of indium acetylacetone containing 5 mol % of stannic chloride (solution II)) in the second furnace, and an FTO film-forming solution (an ethanol solution including 0.5 mol/L of dibutyltin diacetate containing 150 mol % of fluorine (solution (III)) in the third furnace, each solution was converted to a mist using ultrasonic waves, and then sprayed into the respective conveyor furnace using air as a carrier gas. Upon contact with the surface of the glass substrate, each solution underwent thermal decomposition, resulting in the continuous formation of a laminate. The results of measuring the film thicknesses within the resulting laminate using an ellipsometer (SE800, manufactured by Aimec Corporation) revealed a structure composed of glass/$SiO_2$ (40 nm)/ITO (40 nm)/FTO (13 nm). Further, measurement of the sheet resistance value using the four-terminal method yielded a result of 96 Ω/sq, and evaluation of the crystal system of the surface of the FTO film using a horizontal X-ray diffraction apparatus for thin-film evaluation (SmartLab, manufactured by Rigaku Corporation) confirmed an orthorhombic crystal system.

Next, a high-purity titanium oxide powder having an average primary particle size of 20 nm was dispersed in ethyl cellulose to prepare a first paste for screen printing. In addition, a high-purity titanium oxide powder having an average primary particle size of 20 nm and a high-purity titanium oxide powder having an average primary particle size of 400 nm were dispersed in ethyl cellulose to prepare a second paste for screen printing.

The first paste was applied across a region of 1 cm×3 cm to a conductive glass substrate (1.6 cm×3.6 cm) having the above-mentioned orthorhombic FTO film formed thereon, and following drying, the resulting dry coating was calcined for 30 minutes at 500° C. in air, thereby forming a porous titanium oxide film of thickness 10 μm on top of the conductive glass substrate. The second paste was then applied to the porous titanium oxide film, and following drying, the resulting dry coating was calcined for 30 minutes at 500° C. in air, thereby forming a further titanium oxide film of thickness 4 μm on top of the porous titanium oxide film of thickness 10 μm, and completing the semiconductor layer (light-receiving surface area: 3 $cm^2$).

Subsequently, the semiconductor layer was immersed in a solution containing a dye represented by [Ru(4,4'-dicarboxyl-2,2'-bipyridine)$_2$-(NCS)$_2$], and was then removed from the solution and left to stand at room temperature for 24 hours in darkness, thus adsorbing the dye to the semiconductor layer. The solution used was prepared by dissolving the above-mentioned dye in a mixed solvent obtained by mixing acetonitrile and t-butanol in a volumetric ratio of 50:50, with the amount of dye sufficient to yield a concentration of $3 \times 10^4$ mol/$dm^3$.

On the other hand, a 5 mmol/$dm^3$ solution of $H_2PtCl_6$ (in a solvent of isopropyl alcohol) was applied, in an amount of $5 \times 10^{-6}$ l/$cm^2$, to a conductive glass substrate (1.6 cm×3.6 cm) having the above-mentioned orthorhombic FTO film formed thereon, and the applied coating was then subjected to heat treatment at 450° C. for 15 minutes to complete preparation of a counter electrode.

A frame-like main seal material having a width of 1 mm and a thickness of 50 μm was positioned between the electrode provided with the titanium oxide film and the counter electrode so as to surround the periphery of the titanium oxide film, and heating and pressure were then applied simultaneously using a press machine, under conditions including a temperature of 220° C. and a pressure of 1.0 MPa. A thermoplastic synthetic resin (BYNEL, manufactured by DuPont Corporation) was used for the main seal material.

In order to form an electrolyte injection port, a gap having a width of 1 mm and a thickness of 50 μm was provided within the main seal material. An electrolyte injection hole was formed by this gap, and consequently had a cross-sectional area of 0.05 $mm^2$. Subsequently, an electrolyte was injected through the electrolyte injection port using a reduced pressure injection method. The excess electrolyte adhered to the electrolyte injection port was wiped off, and the electrolyte injection port was sealed with an end seal material, thus completing preparation of a dye-sensitized solar cell. The electrolyte was prepared by dissolving 0.5 mol/$dm^3$ of methyltripropylammonium, 0.005 mol/$dm^3$ of iodine, 0.05 mol/$dm^3$ of lithium iodide and 0.5 mol/$dm^3$ of N-methylbenzimidazole in gamma-butyrolactone.

Example 2

With the exception of altering the iodine concentration within the electrolyte to 0.05 mol/$dm^3$, a dye-sensitized solar cell was prepared in exactly the same manner as example 1.

Comparative Example 1

A laminate with substantially the same film thickness values as the examples was prepared by depositing an ITO film having the same composition as that of the examples on a glass base material, temporarily removing the glass base material from the furnace, and then once again introducing the glass base material into a deposition furnace to deposit an FTO film on top of the ITO film.

In the first deposition, with the exceptions of interconnecting only two conveyor furnaces (furnace (1) and (2)) that had been heated to 500° C., feeding a soda lime glass base material (320×420×0.7 mm) through the conveyor furnaces, and using an $SiO_2$ film-forming solution (tetraethoxysilane (solution I)) in the first furnace, and an ITO film-forming solution (an acetylacetone solution including 0.2 mol/L of indium acetylacetone containing 5 mol % of stannic chloride (solution II)) in the second furnace, a laminate was produced in the same manner as example 1. The composition of the resulting laminate was glass/$SiO_2$ (40 nm)/ITO (40 nm).

In the second deposition, with the exceptions of using a single conveyor furnace heated to 500° C., introducing the glass/$SiO_2$/ITO laminate obtained in the first deposition into the conveyor furnace, and using an FTO film-forming solution (an ethanol solution including 0.5 mol/L of dibutyltin diacetate containing 150 mol % of fluorine (solution (III)), a laminate was produced in the same manner as that described for example 1. Evaluation of the resulting laminate using the same methods as those described for example 1 revealed film thicknesses of glass/$SiO_2$ (40 nm)/ITO (40 nm)/FTO (17 nm) and a sheet resistance of 143 Ω/sq, whereas the crystal system of the surface of the FTO film was confirmed as being a tetragonal system.

With the exception of using a conductive glass substrate (1.6 cm×3.6 cm) having this tetragonal FTO film formed thereon, a dye-sensitized solar cell was prepared in exactly the same manner as example 1.

Comparative Example 2

With the exception of using, as the conductive glass substrate, a laminate prepared using a method in which the first deposition was performed in the same manner as comparative example 1, and the second deposition was also performed in the same manner as comparative example 1 but with the exception of using a slower conveyor transport rate than that used in comparative example 1, a dye-sensitized solar cell was prepared in exactly the same manner as example 1.

Evaluation of the resulting laminate using the same methods as those described for example 1 revealed film thicknesses of glass/SiO$_2$ (40 nm)/ITO (40 nm)/FTO (54 nm) and a sheet resistance of 110 Ω/sq, whereas the crystal system of the surface of the FTO film was confirmed as being a tetragonal system.

Comparative Example 3

With the exception of using a conductive glass substrate having an ITO film formed on a glass base material (surface resistance: 200 Ω/sq, thickness: 0.7 mm, 1.6 cm×3.6 cm), a dye-sensitized solar cell was prepared in exactly the same manner as example 1.

<Evaluation of Electric Power Generation Properties>

Of the dye-sensitized solar cells obtained in the manner described above, the properties of the solar cells of example 2 and comparative example 1 were evaluated on the basis of the conversion efficiency, which was calculated as (dye-sensitized solar cell output/incident light energy)×100 using an artificial sunlight (1 Sun) as a light source. The results are shown in Table 1. Further, for the solar cells of examples 1 and 2, and comparative examples 1 and 2, the current-voltage curve was measured under fluorescent light with an illumination intensity of 200 Lx, and the maximum output point $P_{max}$ (W/cm$^2$) was determined for each cell. The results are shown in Table 2.

From Table 1 it is evident that under the artificial sunlight (1 Sun), example 2 that employed the present invention exhibited a higher conversion efficiency than comparative example 1. Further, from Table 2 it is evident that under fluorescent light with an illumination intensity of 200 Lx, examples 1 and 2 that employed the present invention displayed higher $P_{max}$ values than comparative examples 1 and 2.

TABLE 1

| | FTO film crystal system | Sheet resistance | Iodine concentration within electrolyte (mol/dm$^3$) | Conversion efficiency |
|---|---|---|---|---|
| Example 2 | Orthorhombic FTO | 96 Ω/sq | 0.05 | 7.0% |
| Comparative example 1 | Tetragonal FTO | 143 Ω/sq | 0.005 | 5.0% |

TABLE 2

| | FTO film crystal system | Sheet resistance | Iodine concentration within electrolyte (mol/dm$^3$) | $P_{max}$ |
|---|---|---|---|---|
| Example 1 | Orthorhombic FTO | 96 Ω/sq | 0.005 | 8.8 μW/cm$^2$ |
| Example 2 | Orthorhombic FTO | 96 Ω/sq | 0.05 | 8.1 μW/cm$^2$ |
| Comparative example 1 | Tetragonal FTO | 143 Ω/sq | 0.005 | 6.5 μW/cm$^2$ |
| Comparative example 2 | Tetragonal FTO | 110 Ω/sq | 0.005 | 6.7 μW/cm$^2$ |

INDUSTRIAL APPLICABILITY

In the transparent conductive film provided within a dye-sensitized solar cell according to the present invention, because part or all of the FTO film surface has an orthorhombic crystal structure, a dye-sensitized solar cell with excellent heat resistance, a high conversion efficiency and high output can be obtained even when the FTO film is a thin film with a thickness of 5 to 20 nm.

DESCRIPTION OF THE REFERENCE SIGNS

1 Photoelectric conversion element
2, 3 Substrate
6, 9 Base material
7 Electrode layer
10 Counter electrode layer
5 Sealing material
4 Charge transport layer
8 Dye-supporting semiconductor layer

The invention claimed is:

1. A dye-sensitized solar cell comprising:
a first substrate;
a second substrate; and
a charge transport layer sandwiched between the first substrate and the second substrate; wherein
the first substrate comprises: a first base material; an electrode layer formed on a surface of the first base material; a semiconductor layer formed on a surface of the electrode layer while facing the second substrate; and a sensitizing dye supported on the semiconductor layer; and
the second substrate comprises a second base material; and a counter electrode layer formed on a surface of the second base material while facing the first substrate; and
at least one of said electrode layer and said counter electrode layer is a transparent conductive film prepared by laminating an ITO film and an FTO film, part or all of a crystal structure of a surface of said FTO film is orthorhombic, a thickness of said FTO film is within a range of from 5 to 20 nm, and a thickness of said ITO film is within a range of from 20 to 60 nm.

2. The dye-sensitized solar cell according to claim 1, wherein a sheet resistance of said transparent conductive film is not more than 300 Ω/sq.

3. The dye-sensitized solar cell according to claim 1, wherein a concentration of $I_3^-$ contained within said charge transport layer exceeds 0 mol/dm$^3$ but is not more than 0.02 mol/dm$^3$.

4. The dye-sensitized solar cell according to claim 2, wherein a concentration of $I_3^-$ contained within said charge transport layer exceeds 0 mol/dm$^3$ but is not more than 0.02 mol/dm$^3$.

* * * * *